United States Patent
Marinov Peev et al.

(10) Patent No.: US 10,830,819 B2
(45) Date of Patent: Nov. 10, 2020

(54) SENSOR DEFECT DIAGNOSTIC CIRCUIT

(71) Applicant: Melexis Bulgaria Ltd, Sofia (BG)

(72) Inventors: Rumen Marinov Peev, Sofia (BG); Stoyan Georgiev Gaydov, Sofia (BG)

(73) Assignee: MELEXIS BULGARIA LTD, Sofia (BG)

( * ) Notice: Subject to any disclaimer, the term of this patent is extended or adjusted under 35 U.S.C. 154(b) by 31 days.

(21) Appl. No.: 16/154,960

(22) Filed: Oct. 9, 2018

(65) Prior Publication Data

US 2019/0107578 A1   Apr. 11, 2019

(30) Foreign Application Priority Data

Oct. 10, 2017 (EP) ..................................... 17195716

(51) Int. Cl.
| | | |
|---|---|---|
| *G01R 31/3185* | (2006.01) | |
| *G01R 31/3187* | (2006.01) | |
| *H01L 43/06* | (2006.01) | |
| *H01L 43/04* | (2006.01) | |
| *G01R 33/07* | (2006.01) | |

(Continued)

(52) U.S. Cl.
CPC ..... *G01R 31/318511* (2013.01); *G01D 18/00* (2013.01); *G01D 21/00* (2013.01); *G01R 31/3187* (2013.01); *G01R 33/0035* (2013.01); *G01R 33/07* (2013.01); *H01L 43/04* (2013.01); *H01L 43/065* (2013.01)

(58) Field of Classification Search
CPC .... G01C 1/00; G01P 1/00; G01R 1/00; H01R 3/00; H01R 2101/00
See application file for complete search history.

(56) References Cited

U.S. PATENT DOCUMENTS

| 5,553,489 A | 9/1996 | Connell et al. |
| 7,622,367 B1 | 11/2009 | Nuzzo et al. |

(Continued)

FOREIGN PATENT DOCUMENTS

| DE | 102012200245 A1 | 7/2012 |
| WO | 2015038564 A1 | 3/2015 |

OTHER PUBLICATIONS

Cok et al., "AMOLED Displays With Tranfer-Printed Integrated Circuits," Journal of the Society for Information Display, vol. 19, No. 4, 2011, pp. 335-341.

(Continued)

*Primary Examiner* — Jermele M Hollington
*Assistant Examiner* — Temilade S Rhodes-Vivour
(74) *Attorney, Agent, or Firm* — Workman Nydegger

(57) ABSTRACT

A sensor device comprises a sensor connected to a first signal and responsive to an external field to produce a sensor signal, a test device connected to a second signal and electrically connected in series with the sensor by an electrical test connection providing a test signal, and a monitor circuit electrically connected to the first, second and test signals. The monitor circuit comprises a processing circuit and a determination circuit. The processing circuit is responsive to the test signal and a predetermined processing value to form a processing output signal. The determination circuit is responsive to the processing output signal to determine a diagnostic signal. A sensor circuit responsive to the sensor signal provides a sensor device signal responsive to the external field.

11 Claims, 5 Drawing Sheets

(51) Int. Cl.
*G01D 21/00* (2006.01)
*G01D 18/00* (2006.01)
*G01R 33/00* (2006.01)

(56) References Cited

U.S. PATENT DOCUMENTS

| | | |
|---|---|---|
| 7,800,389 B2 | 9/2010 | Friedrich et al. |
| 8,447,556 B2 | 5/2013 | Friedrich et al. |
| 8,506,867 B2 | 8/2013 | Menard |
| 8,722,458 B2 | 5/2014 | Rogers et al. |
| 8,889,485 B2 | 11/2014 | Bower |
| 9,520,537 B2 | 12/2016 | Bower et al. |
| 9,652,905 B2 | 5/2017 | Peev et al. |
| 2005/0038623 A1* | 2/2005 | Hammerschmidt .................. G01R 31/2829 702/118 |
| 2010/0001177 A1* | 1/2010 | Dolenti .............. G01D 5/24461 250/231.15 |
| 2011/0054813 A1* | 3/2011 | Moreau .............. G01N 27/9006 702/59 |
| 2011/0095768 A1* | 4/2011 | Cheung ............ G01R 31/31725 324/617 |
| 2015/0185279 A1 | 7/2015 | Milano et al. |
| 2015/0241494 A1* | 8/2015 | Miyanaga ............. H03F 1/3294 324/613 |
| 2015/0289073 A1* | 10/2015 | Salvia .................. H04R 19/005 381/58 |
| 2015/0331016 A1 | 11/2015 | Malhan et al. |
| 2016/0093600 A1 | 3/2016 | Bower et al. |
| 2016/0252599 A1 | 9/2016 | Motz et al. |
| 2016/0299200 A1 | 10/2016 | Taylor et al. |
| 2017/0176566 A1 | 6/2017 | Monreal et al. |

OTHER PUBLICATIONS

Extended European Search Report from EP Application No. EP 17195716, dated May 11, 2018.

* cited by examiner

SENSOR DEFECT DIAGNOSTIC CIRCUIT

FIELD OF THE INVENTION

The present invention is generally related to the field of integrated sensor diagnostic structures, circuits and methods.

BACKGROUND OF THE INVENTION

Sensors are widely used in electronic devices to measure attributes of the environment and report a measured sensor value. In particular, magnetic sensors are used to measure magnetic fields, for example in transportation systems such as automobiles. Magnetic sensors can incorporate Hall-effect sensors that generate an output voltage proportional to an applied magnetic field or magneto-resistive materials whose electrical resistance changes in response to an external magnetic field.

In many applications, it is desirable that sensors are small and are integrated with an electronic processing circuit so as to reduce the overall sensor system size and provide improved measurements and integration into external electronic systems. For example, US2016/299200 describes a Hall-effect magnetic sensor for measuring magnetic fields incorporating an integrated circuit formed in a semiconductor material on a substrate, together with insulation and adhesive layers.

Measurements from sensors can drift over time, providing varying measurements even when exposed to the same field. For example, the field measurements can be offset from a desired nominal value, the sensitivity can vary so that measurements are a multiple (either greater or less than one) of the desired value, or both. Such variation can be the result of changes in environmental conditions, for example temperature or humidity, or operational factors, such as vibration or aging. Moreover, devices can fail over time for similar reasons. Furthermore, the materials from which sensors are made can have defects that affect the accuracy, offset bias or symmetry of the sensor's response.

It is important, therefore, to include diagnostic capabilities to detect faults or failures in complex, safety-critical systems, such as automotive systems, so that repairs can be performed or replacements can be provided for any faulty or failed devices. For example, U.S. Pat. No. 5,553,489 describes a diagnostic system for measuring the behaviour of signals provided by a plurality of sensors that includes a plurality of input filters for receiving signals from each of the plurality of sensors and for providing a plurality of filtered sensor signals each derived from the received signals. A signal bandwidth of each of the plurality of filtered sensor signals is lower than a signal bandwidth of the signal bandwidth of the associated received signal. A selection circuit receives each of the signals from each of the plurality of sensors and, dependent on a selection signal, provides a selected sensor signal derived from one of the received signals, wherein the selected sensor signal has a signal bandwidth greater than one of the filtered sensor signals derived from the one of the received signals.

In another example, WO2015/038564 describes a method for verifying measurements from a magnetic Hall-effect sensor in a Hall-effect sensor system. In this approach, the Hall-effect sensor is excited with an excitation current having a first value. A first measurement corresponding to a voltage output of the Hall-effect sensor when the Hall-effect sensor is excited with the excitation current having the first value is obtained. Additionally, the Hall-effect sensor is excited with the excitation current having a second value, the second value different than the first value. A second measurement corresponding to a voltage output of the Hall-effect sensor when the Hall-effect sensor is excited with the excitation current having the second value is obtained. Operation of the Hall-effect sensor is then verified based at least on the first measurement and the second measurement.

Another approach to managing diagnostics in a magnetic field sensor is described in US2016/252599A1. This design uses switches associated with a magnetic field sensor that provide error information. In particular, a device is provided that includes a magnetic field sensor, a plurality of switches associated with the magnetic field sensor, and a control circuit configured to control the plurality of switches and to provide at least one signal indicative of a fault based on operation of the switches.

Yet another design, described in US2015/185279, provides a method and apparatus for an integrated circuit having a magnetic sensing element and fault detection module coupled to the sensing element, the fault detection module including circuitry to detect a fault condition and to self-test operation of the circuitry for detecting the fault condition. In illustrative embodiments, a fault pin indicates the fault condition. U.S. Pat. No. 7,800,389 describes an integrated circuit having a sensor for providing a sensor output signal and a diagnostic circuit coupled to the sensor for providing a self-diagnostic signal. The self-diagnostic signal comprises the sensor output signal during a first time duration and an inverted sensor output signal during a second different time duration.

U.S. Pat. No. 9,652,905 discloses a sensor integrated circuit comprising a controller and a diagnostic module in communication with the controller. The controller is configured for providing a diagnostic reporting signal being a periodic superposition signal on a sensing output of the sensor integrated circuit and/or on a supply current of the sensor integrated circuit. The periodic superposition signal has periodic pukes with a predetermined fixed puke duration and a predetermined periodicity. The controller furthermore is configured for altering the predetermined periodicity or predetermined fixed pulse duration of the periodic superposition signal upon a fault detection in the diagnostic module communicated to the controller.

U.S. Pat. No. 8,447,556 teaches a magnetic field sensor that includes built in sell-test circuits that allow a self-test of most, or all, of the circuitry of the magnetic field sensor, including self-test of a magnetic field sensing element used within the magnetic field sensor, while the magnetic field sensor is functioning in normal operation.

However, these approaches and others similar to them do not necessarily operate the sensor system under critical operating conditions and can therefore provide a false positive result. Moreover, field sensors are subject to faults or defects in the sensor materials leading to incorrect field measurements.

There is a need therefore, for circuits and methods in sensor systems that operate and test sensor systems to detect or correct faults in the sensor under critical operating conditions.

SUMMARY OF THE INVENTION

It is an object of embodiments of the present invention to provide for a sensor device that is capable of detecting an error in a sensor of the device. It is also an object to present a sensor diagnostic method.

The above objective is accomplished by the solution according to the present invention.

Embodiments of the present invention provide a sensor device that comprises a sensor responsive to an external environmental attribute to produce a sensor signal representing a physical quantity of the environmental attribute. The sensor is electrically connected to a first signal, a test device is electrically connected in series with the sensor by an electrical connection, the electrical connection providing a test signal, and the test device is a test sensor which is a substantial duplicate of the sensor and electrically connected to a second signal, wherein the first signal, the second signal and the test signal are different signals. A monitor circuit is electrically connected to the first, second and test signals, the monitor circuit comprising a processing circuit and a determination circuit. The processing circuit is responsive to the test signal, to the first and second signals, and/or to a predetermined processing value to form a processing output signal. The determination circuit is responsive to the processing output signal to determine a diagnostic signal.

In some configurations the first signal, second signal and test signals are analog voltage signals. In other configurations the first signal is a first voltage bias signal and the second signal is a second voltage bias signal different from the first voltage bias signal, e.g., power and ground signals, or the first signal is a second voltage bias signal and the second signal is a first voltage bias signal. In some embodiments the sensor signal is a differential signal comprising a first sensor signal and a second sensor signal.

In various embodiments of the present invention the monitor circuit is directly or indirectly electrically connected to the first signal and to the second signal and/or the processing circuit is responsive to the first signal and the second signal. The processing circuit can comprise a comparator, a divider, an amplifier, an operational amplifier or a differential amplifier. The determination circuit and/or processing circuit can be an analog circuit, a digital circuit or a mixed-signal circuit and can comprise an analog-to-digital convertor. The processing output signal can be a digital signal and the determination circuit can be a digital circuit. The processing circuit can measure the voltage of the first, second or test signals or the processing circuit can measure the current through the test device or the sensor.

In some configurations the test device is a precision resistor with a known variability of less than or equal to 10%, less than or equal to 5% less than or equal to one percent, less than or equal to one-half percent, less than or equal to one-fifth percent, or less than or equal to one-tenth percent. The test device can have a resistance less than or equal to one thousand ohms, less than or equal to one 100 ohms, less than or equal to ten ohms, less than or equal to five ohms, less than or equal to two ohms, or less than or equal to one ohm.

In various embodiments of the present invention, the sensor is a Hall-effect sensor or a magneto-resistive sensor such as a GMR (giant magnetoresistance), CMR (colossal magnetoresistance), EMR (extraordinary magnetoresistance), TMR (tunnel magnetoresistance), or AMR (anisotropic magnetoresistance) sensor. The sensor can be a bridge sensor, for example a Hall-effect sensor.

In some embodiments of the present invention, the test device is a test sensor. The test sensor can be a substantial duplicate or replica of the sensor or identical to the sensor, within manufacturing limitations. A substantial duplicate or replica can have different sizes, proportions, or process variations than the original, but utilizes the same physical effects. The test device can surround the sensor or the sensor can surround the test device. The test device can have a spatial dimension and the test device can be at least as close to or closer to the sensor than the spatial dimension, for example less than 200 microns, 100 microns, 50 microns or 10 microns.

In some configurations the processing circuit processes and/or measures the voltage of the first, second or test signals or, in other configurations, the processing circuit processes and/or measures the current through the test device or the sensor.

In some embodiments of the present invention the sensor is a field sensor and the environmental attribute is a field, for example, a magnetic field, an electrical field, a pressure field or a gravitational field. In other embodiments the sensor is not a field sensor, for example the sensor is an acceleration, a temperature or a pressure sensor, and the physical quantity measured is an acceleration, temperature or pressure value.

According to embodiments of the present invention, a sensor diagnostic method comprises (i) providing a sensor device, (ii) using an external power source, for example a current or voltage source that can be the supply voltage of the sensor device, to provide a voltage bias such as power and ground signals to the sensor device, (iii) using the processing circuit to measure the test signal and, responsive to a predetermined processing value and the measured test signal, to provide a measured signal, and (iv) using the determination circuit responsive to the processing output signal to determine the diagnostic signal.

In some methods the sensor is a bridge sensor having at least four terminals and at least first and second operational phases, and the methods further comprise determining a diagnostic signal in each of the first and second operational phases. In other embodiments of the present invention, the sensor device has more than two operational phases.

Embodiments of the present invention provide sensor devices having improved diagnostic capability using smaller and less expensive circuits and can compensate for or detect faults or fine defects in the sensor or sensor material. Faults can include, but are not limited to, disconnection, high-resistance connections, short circuits or material faults. The detection can occur at the same time that the sensor circuit is operating.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The foregoing and other objects, aspects, features and advantages of the present disclosure will become more apparent and better understood by referring to the following description taken in conjunction with the accompanying drawings.

DETAILED DESCRIPTION OF ILLUSTRATIVE EMBODIMENTS

Figure 1:
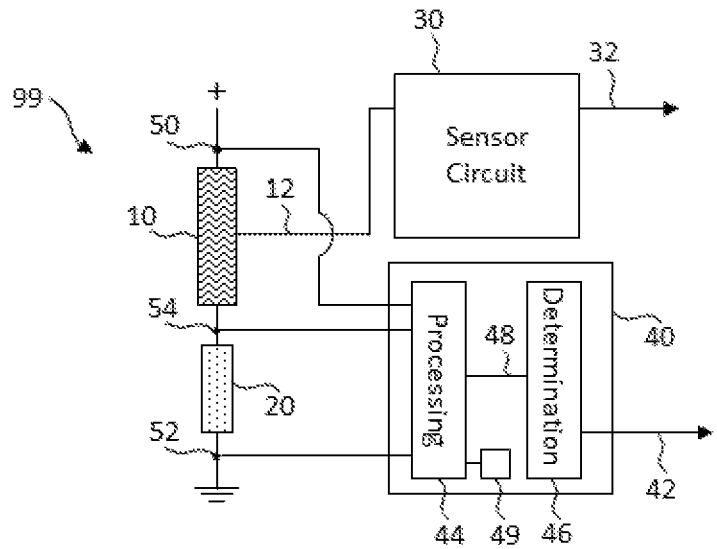
FIG. 1 represents a schematic of illustrative embodiments of the present invention.

The present invention will be described with respect to particular embodiments and with reference to certain drawings but the invention is not limited thereto but only by the claims. The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

Embodiments of the present invention provide sensor devices having improved diagnostic capabilities using smaller and less expensive circuits and can compensate for, detect or diagnose faults or fine defects in the sensor material or damage to the sensor while the sensor device is operating. Such defects can be inherent in the material used to make the sensor or can be formed over time, as a result of use, or in response to mechanical or other environmental stresses on the sensor.

Referring to FIG. 1, in embodiments of the present invention a sensor device 99 comprises a sensor 10 for sensing environmental attributes such as fields and measuring the environmental attribute to determine a physical quantity, amount or level of the environmental attribute. The sensor 10 provides a sensor signal 12 formed in response to a sensed environmental attribute. The sensor 10 is electrically connected to a first signal 50. The sensor signal 12 can be an electrical signal, for example a voltage on a single wire with reference to a separate reference voltage bias signal, for example a ground signal, as shown in FIG. 1. The sensor 10 can also be directly or indirectly electrically connected to a first voltage bias signal (for example a power signal, indicated with a '+' sign) and a second voltage bias signal (for example a ground signal, indicated with the earth symbol) by wires or other electrical conductors.

A test device 20 is electrically connected in series with the sensor 10 by an electrical test connection providing a test signal 54. The electrical test connection can be a wire or other electrical conductor that carries the test signal 54. The test device 20 is also electrically connected to a second signal 52 with other wires or electrical conductors different from the electrical test connection. The first, second and test signals, 50, 52, 54 are different signals carried by different electrical conductors such as wires or integrated circuit or printed circuit board traces. In embodiments of the present invention, the first signal 50 is the first voltage bias signal, e.g., power, and the second signal 52 is the second voltage bias signal, e.g., ground, (as shown in FIG. 1), or the first signal 50 is the second voltage bias signal (e.g., ground) and the second signal 52 is the first voltage bias signal (e.g., power, not shown in FIG. 1). The first and second voltage bias signals can be, but are not necessarily, a same power and ground provided to or derived from other circuit elements such as the sensor circuit 30 and monitor circuit 40 described below, to provide power to the circuits, or can be from an entirely different source. Likewise, the first and second signals 50, 52 can be the same power and ground provided to other circuit elements such as the sensor circuit 30 and the monitor circuit 40 or can be derived from the same power and ground, or vice versa. Alternatively, the first and second signals 50, 52 can be derived from an entirely different source than the power and ground signals, for example a sensor-controlling circuit such as sensor circuit 30, which can provide the first and second voltage bias signals (not shown in FIG. 1).

The sensor signal 12 is electrically connected with a wire or other electrical conductor to a sensor circuit 30. The sensor circuit 30 receives the sensor signal 12 and processes the sensor signal 12 as necessary to produce a sensor device signal 32 that represents the physical value of the sensed environmental attribute and can be communicated to other, external electrical systems, computers or devices (not shown in FIG. 1). The sensor circuit 30 can be directly or indirectly electrically connected to the first signal 50 and to the second signal 52, for example through power and ground signals (not shown in FIG. 1) or can provide the first and second signals 50, 52 (first and second voltage bias signals). In alternative embodiments the sensor circuit 30 is electrically connected to the test signal 54. According to embodiments of the present invention, any one, any combination or all of the first and second voltage bias signals, power signal, ground signal and test signal 54 are analog voltage signals. In some embodiments of the present invention, in order to compensate for external parameters such as temperature and/or pressure, the sensor circuit 30 can accept a compensation input signal in order to modulate its output voltage or current intended to compensate for such external parameter effects. In such embodiments the compensation input signal is representative of the bias current or voltage and can be used as the first signal 50 of the sensor 10 and, optionally, of the controlling sensor circuit 30.

A monitor circuit 40 is electrically connected to the test signal 54 and is either directly or indirectly electrically connected to the first and second signals 50, 52. An indirect electrical connection is one that is processed or passes through another circuit element before it is electrically connected to the monitor circuit 40, such as a switching circuit. The monitor circuit 40 comprises a processing circuit 44 responsive to the test signal 54 and a predetermined processing value 49 to form a processing output signal 48 (i.e., a measurement signal representing a measured value or physical quantity of an environmental attribute) and a determination circuit 46 responsive to the processing output signal 48 to determine a diagnostic signal 42. Thus, the processing circuit 44 can also comprise a measurement circuit. The processing circuit 44 can also be directly or indirectly electrically connected to the first and second signals 50, 52, as shown in FIG. 1. In some embodiments, the determination circuit 46 is a pass-through circuit (e.g., an electrical connection) and the processing output signal 48 is also the diagnostic signal 42.

The processing circuit 44 can comprise a comparison circuit, can be an analog circuit, and can comprise a comparator, an operational amplifier or a differential amplifier and the processing output signal 48 can be an analog signal such as a voltage. Similarly, the determination circuit 46 can be an analog circuit and the diagnostic signal 42 can be an analog signal such as a voltage. In other embodiments, the processing circuit 44 includes one or more analog-to-digital convertors and can include digital circuitry, the processing output signal 48 is a digital signal, the determination circuit 46 includes or is a digital circuit and the diagnostic signal 42 is a digital signal.

In some embodiments of the present invention, the environmental attribute is a field, for example a magnetic field, an electrical field, a pressure field or a gravitational field. In other embodiments, the environmental attribute is acceleration, temperature, or pressure.

In various embodiments the sensor 10 can be a Hall-effect sensor or a magneto-resistive sensor. The test device 20 can be a precision resistor with a known variability of less than or equal to one percent, or less than or equal to one-half percent, or less than or equal to one-fifth percent, or less than or equal to one-tenth percent. The test device 20 can have a resistance less than or equal to one thousand ohm, less than or equal to one hundred ohm, less than or equal to ten ohms, less than or equal to five ohm, less than or equal to two ohm or less than or equal to one ohm.

In embodiments of the present invention the sensor 10 and the test device 20 form a voltage divider. A voltage divider can be a passive linear circuit having an output (e.g., test signal 54) that is a fraction of the input voltage (e.g., the voltage ratio between the first and second voltage bias signals). The output voltage (test signal 54) is dependent on the relative resistance of the circuit components. In an embodiment the first signal 50 is a power signal, the second signal 52 is a ground signal (or vice versa) and the voltage of the test signal 54 is a value corresponding to the ratio of the resistances of the sensor 10 and the test device 20 times the difference in voltage between the first and second signals 50, 52.

In embodiments of the present invention the voltage of the test signal 54 is input by the processing circuit 44 of the monitor circuit 40. The voltage is measured, in some embodiments, by an analog-to-digital convertor that converts the voltage to a digital value. The processing circuit 44 can then compare the digital value to a predetermined digital processing value 49 that is representative of a properly functioning sensor 10, for example using digital logic circuits such as adders or comparators, to derive a digital processing output signal 48 whose digital magnitude is relative to the difference between the desired predetermined processing value 49 and the test signal 54. In other embodiments, the voltage of the test signal 54 is measured using analog electronics, for example an analog operational amplifier arranged in a differential amplifier configuration to derive an analog processing output signal 48 whose analog voltage magnitude is relative to the difference between the desired predetermined processing value 49 and the test signal 54. In an analog embodiment the predetermined processing value 49 can be established using a voltage divider with predetermined resistance values, for example using precision resistors.

The digital or analog processing output signal 48 is then analyzed to determine if it is within a range of acceptable values, for example within 1%, 2%, 5%, 10%, or 20% of the desired value. The analysis can be done by the determination circuit 46. If the processing output signal 48 is within the acceptable range, the diagnostic signal 42 is set to a value representing a functioning sensor device 99. If the processing output signal 48 is not within the acceptable range, the diagnostic signal 42 is set to a value representing a faulty sensor device 99. In a digital embodiment, the determination can be made using digital logic and arithmetic circuits, such as comparators. In an analog embodiment, the determination can be made using analog operational amplifiers and switches or other equivalent circuits that provide the determination function. The diagnostic signal 42 can be a binary signal. The acceptable range can be predetermined, either with a pre-set or programmed digital value or with analog circuit elements selected to provide the acceptable range.

Figure 2:
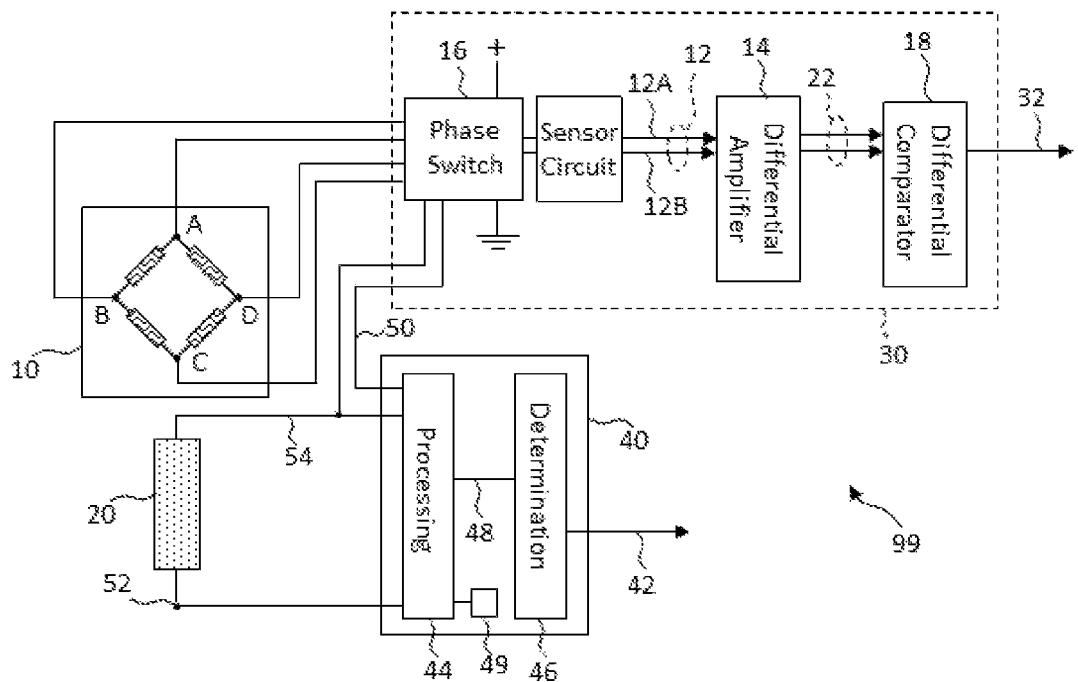
FIG. 2 represents a schematic of other illustrative embodiments of the present invention.

In other embodiments of the present invention, referring to FIG. 2, the sensor device 99 comprises a sensor 10 that is a bridge sensor and has at least four circuit connections A, B, C, and D, as shown. The sensor signal 12 is a differential signal comprising first and second sensor signals 12A, 12B whose value is the difference between the first and second sensor signals 12A, 12B. The first and second sensor signals 12A, 12B are provided on two opposing circuit connections, for example B and D (as shown in FIG. 2) or A and C (not shown in FIG. 2). The other two opposing circuit connections, for example A and C (as shown in FIG. 2) or B and D (not shown in FIG. 2) can provide voltage bias connections to the sensor 10 (e.g., power and ground). The monitor circuit 40 is electrically connected to the test signal 54 through the phase switch 16, as shown in FIG. 2 and, for example corresponding to circuit connection C of the bridge sensor 10. If the B and D connections are the voltage bias connections (bias high and bias low), the test signal 54 can be connected to the second voltage bias connection (e.g., ground), for example connection B, through the phase switch 16. The monitor circuit 40 can also be connected to other circuit connections (e.g., circuit connection A corresponding to the first signal 50, as shown in FIG. 2) and to the second signal 52, depending on the phase switch control mode.

In embodiments of the present invention, the sensor device 99 has two or more operational phases (control modes) and the sensor 10 is operated in different operational phases under the control of the phase switch 16. The phase switch 16 provides first and second voltage bias signals (bias high and bias low) to two of the four circuit connections (e.g. A, C) and selects two others (e.g., B, D) as a differential sensor signal 12 inputs (or vice versa) and provides the first signal 50 and test signal 54 to the monitor circuit 40, depending on the phase switch 16 connections. The phase switch 16 can include electronic switches, relays, mechanical switches or any suitable switching mechanism for electrically connecting the first and second voltage bias signals to opposing pairs of circuit connections and selecting the sensor signals 12 from other opposing pairs of circuit connections. Thus, in some embodiments, the first and second signals 50, 52 are a first and second voltage bias signal (e.g., power and ground, as in FIG. 1). In other embodiments, the first and second signals 50, 52 are a sensor signal 12 differential pair first sensor signal 12A and second sensor signal 12B. In either case, the voltage of the test signal 54 indicates any faults in the sensor 10. In further embodiments of the present invention, the sensor device 99 has more than two operational phases.

The selected differential first and second sensor signals 12A, 12B are optionally amplified as desired by the differential amplifier 14 to produce a differential amplified sensor signal 22 that is compared or otherwise processed by the differential comparator 18 to provide the sensor device signal 32. The differential amplifier 14 and the differential comparator 18 can be a common circuit or integrated in a common integrated circuit.

The monitor circuit 40 operates as described above and can be controlled to provide two diagnostic signals 42 at different times, each responsive to one of the two operational phases. The two diagnostic signals 42 can be combined by the monitor circuit 40 into a single, reported diagnostic signal 42.

Figure 3A:
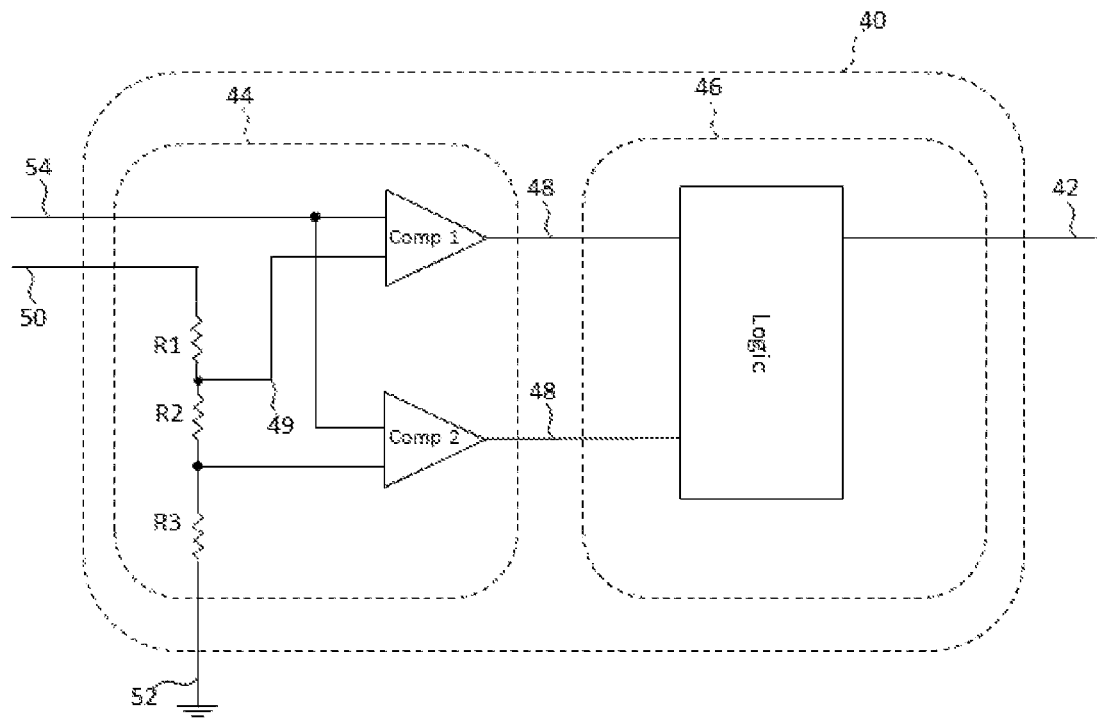
FIGS. 3A, 3B and 3C represent schematics of different monitor circuits according to illustrative embodiments of the present invention.

Referring to FIG. 3A, in some analog embodiments of the present invention employing voltage signals, the monitor circuit 40 includes a processing circuit 44 responsive to the test signal 54. The test signal 54 is input by two operational amplifiers configured as differential amplifiers comparator Comp 1 and comparator Comp 2, that can form a window comparator. The relative values of resistors R1, R2, and R3 serially connected in a voltage divider produce the predetermined comparative values establishing the range or acceptance window of the processing values, for example to provide a diagnostic tolerance window wherein if the test signal is in the diagnostic tolerance window, no error is reported by the determination circuit 48.

Resistors R1, R2, and R3 can be precision resistors and can have a large value to reduce current through the voltage divider or a small value to reduce power loss. The relative values of resistors R1, R2, R3 are selected to match the desired relative resistances and acceptable processing values of the sensor 10 and the test device 20. The comparators Comp 1 and Comp 2 can also be supplied with operational power through connections to the first and second voltage bias signals or power and ground signals, as shown, or the first and second signals 50, 52 can be power signals and ground signals, as shown, and can be the same signals that provide power to the sensor and monitor circuits 30, 40, or can be different signals, for example differential sensor signals 12A, 12B, as controlled by the phase switch 16. The first and second signals 50, 52 can be provided indirectly through the phase switch 16 (not shown in FIGS. 1 and 3A).

The output voltage of the comparators Comp 1 and Comp 2 (processing output signal 48) will be small if the resistance of the sensor 10 is as desired and matches the desired operational ranges, indicating a properly functional sensor 10 and will be large otherwise. (The comparators Comp 1 and Comp 2 can include multiple elements or operational amplifiers and can be an absolute value operational amplifier that provides an output corresponding to the absolute value of the difference between the test signal 54 and the predetermined processing value 49, not shown.)

The processing output signals 48 output from each of the comparators Comp 1 and Comp 2 by processing circuit 44 are input by the determination circuit 46. Digital or analog logic can be used to produce the diagnostic signal 42.

Figure 3B:
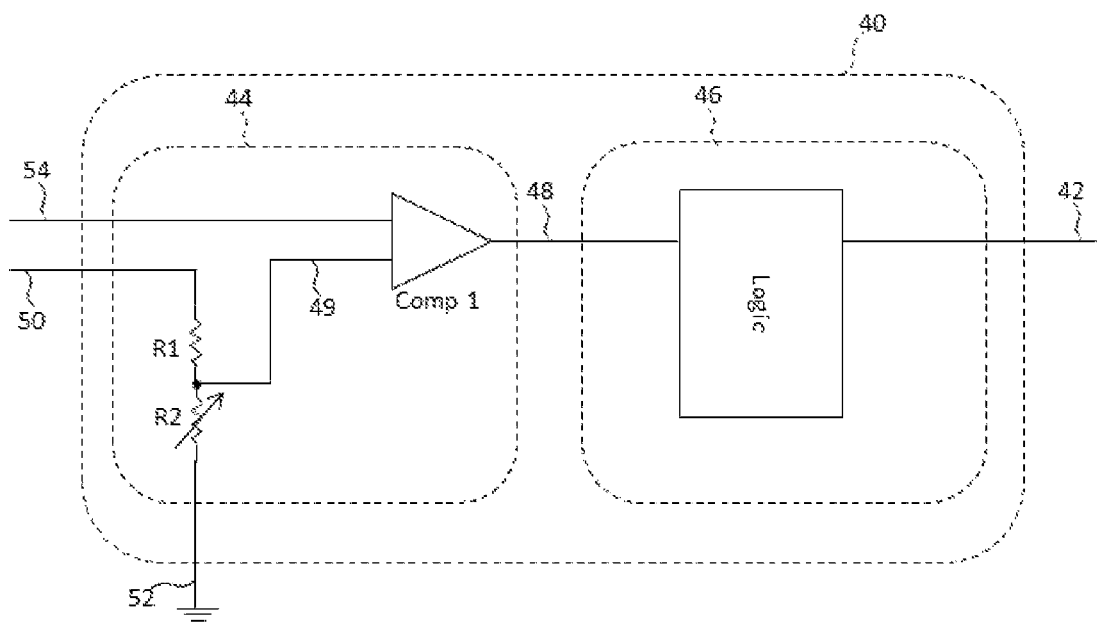
Figure 3C:
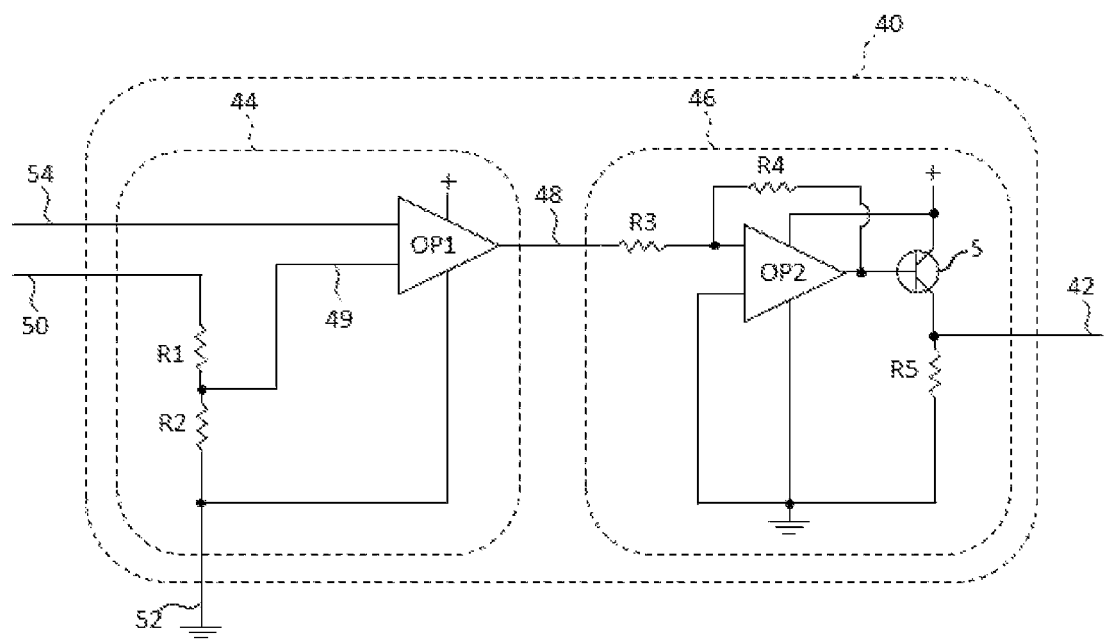

Referring to FIG. 3B, in some analog embodiments of the present invention employing voltage signals, the monitor circuit 40 includes a processing circuit 44 responsive to the test signal 54. The test signal 54 is input by an operational amplifier configured as a differential amplifier (comparator) Comp 1. The predetermined processing value 49 can be set by the relative values of resistors R1, R2 serially connected in a voltage divider, as shown, producing the comparative predetermined operation value 49. R2 can be a variable resistor, as shown in FIG. 3B, to accommodate different sensors or measurement scenarios, or can be a fixed resistor, as shown in FIG. 3C. Resistors R1 and R2 can be precision resistors and can have a large value to reduce current through the voltage divider or a small value to reduce power loss. The relative values of resistors R1, R2 are selected to match the desired relative resistances of the sensor 10 and the test device 20 (as shown in FIG. 1). With reference also to FIG. 1, the relative resistance of the sensor 10 corresponds to the relative resistance of resistor R1 and the relative resistance of the test device 20 corresponds to the relative resistance of resistor R2. The comparator Comp 1 can also be supplied with operational power through connections to the first and second voltage bias signals or power and ground signals, as shown or the first and second signals 50, 52 can be power signals and ground signals, as shown, and can be the same signals that provide power to the sensor and monitor circuits 30, 40, or can be different signals, for example differential sensor signals 12A, 12B, as controlled by the phase switch 16. The first and second signals 50, 52 can be provided indirectly through the phase switch 16 (not shown in FIGS. 1 and 3A).

The output voltage of the comparator Comp 1 (processing output signal 48) will be small if the resistance of the sensor 10 is as desired and matches the relative resistances of resistors R1, R2, indicating a properly functional sensor 10. The output voltage of the comparator Comp 1 (processing output signal 48) will be large if the resistance of the sensor 10 is not as desired and does not match the relative resistances of resistors R1, R2, indicating a faulty sensor 10 (or a faulty test device 20). The comparator Comp 1 can include multiple elements or operational amplifiers and can be an absolute value operational amplifier that provides an output corresponding to the absolute value of the difference between the test signal 54 and the predetermined processing value 49, not shown.

The comparator Comp 1 can be used in a time-multiplexed manner to provide a diagnostic tolerance window by varying the R2 resistance (as for example to the equivalent values of R2 and R2+R3 of the embodiment illustrated in FIG. 3A discussed above) and storing or processing all combined results in the determination circuit 46.

The processing output signal 48 output from the processing circuit 44 is input by the determination circuit 46. Digital or analog logic can be used to determine if the processing output signal 48 is within an acceptable range (an acceptance window) and produce the diagnostic signal 42.

If an analog output representing a range of functional levels is desired, the output from operational amplifier Comp 1 can be used (or indeed can be the processing output signal 48 with a pass-through determination circuit 46, e.g., a simple electrical connection). In such embodiments, the determination circuit 46 and the processing circuit 44 are the same or are a common circuit.

Referring to FIG. 3C, in some analog embodiments of the present invention employing voltage signals, the monitor circuit 40 includes a processing circuit 44 responsive to the test signal 54, as in FIG. 3B. However, FIG. 3C shows an analog determination circuit 46 in more detail.

The processing output signal 48 output from the processing circuit 44 is input by the determination circuit 46. Operational amplifier OP2 is configured in a scale mode that amplifies the input processing output signal 48 by a scale factor equal to R4/R3 (where the processing output signal 48 is connected to the non-inverting input of operational amplifier OP2). Resistors R3 and R4 can be precision resistors. The relative values of resistors R3, R4 are selected to match the desired acceptable range of functional test signal 54 values and provide a scale factor of the processing output signal 48 designed to operate switch S (e.g., a transistor) when the test signal 48 is sufficiently different from the predetermined processing value 49. If the output from operational amplifier OP2 is too small, switch S remains off and the diagnostic signal 42 is pulled low (ground) by resistor R5, indicating no fault. If the output from operational amplifier OP2 is sufficiently large, switch S turns on and the diagnostic signal 42 is connected to the power signal (through the switch S), indicating a fault. Thus, the diagnostic signal 42 is a binary signal representing the operational state of the sensor 10. If an analog output representing a range of functional levels is desired, the output from operational amplifier OP2 can be used (or indeed can be the processing output signal 48 with a pass-through determination circuit 46, e.g., a simple electrical connection). In such embodiments, the determination circuit 46 and the processing circuit 44 are the same or are a common circuit.

The embodiments illustrated in FIGS. 3A-3C are only some of the many design possibilities; those skilled in the electronic and computing arts will understand that many monitor circuit 40 designs are possible. In some embodiments the distinctions between the processing circuit 44 and the determination circuit 46 is functional; the functions can be integrated in a common circuit. Other embodiments of the monitor circuit 40 can employ other analog circuit designs, analog-to-digital converters or digital designs using state machines or programmable machines such as a CPU with a program stored in a memory. The present invention is not limited by any specific monitor circuit 40 design or embodiment.

Figure 4:
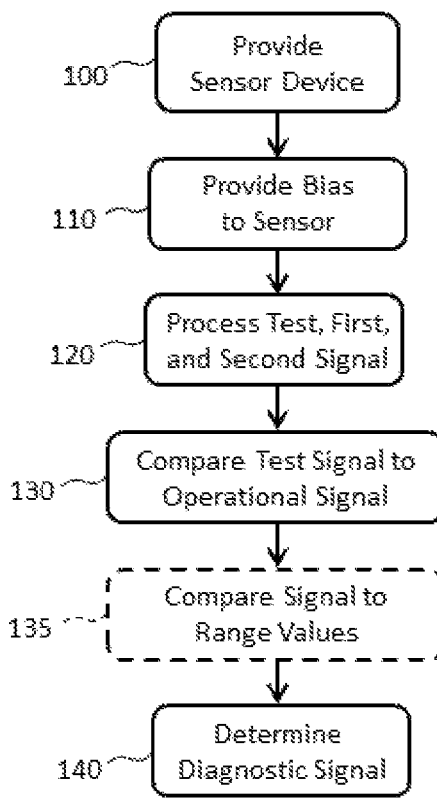
FIG. 4 illustrates a flow chart of a method according to illustrative embodiments of the present invention.

Referring to FIG. 4, in an embodiment of the present invention a sensor device 99 is operated by first providing the sensor device 99 in step 100 and then providing power to the sensor device 99 in step 110. The test signal 54 is measured in step 120, for example by processing the test, first and second signals 54, 50, 52 with the processing circuit 44, and compared to the predetermined processing value 49 in step 130 to produce the processing output signal 48. The diagnostic signal 42 is determined, for example by the determination circuit 46, in step 140. In an optional step 135, the processing output signal 48 is compared to predetermined range values as part of the diagnostic signal 42 determination.

Figure 5:
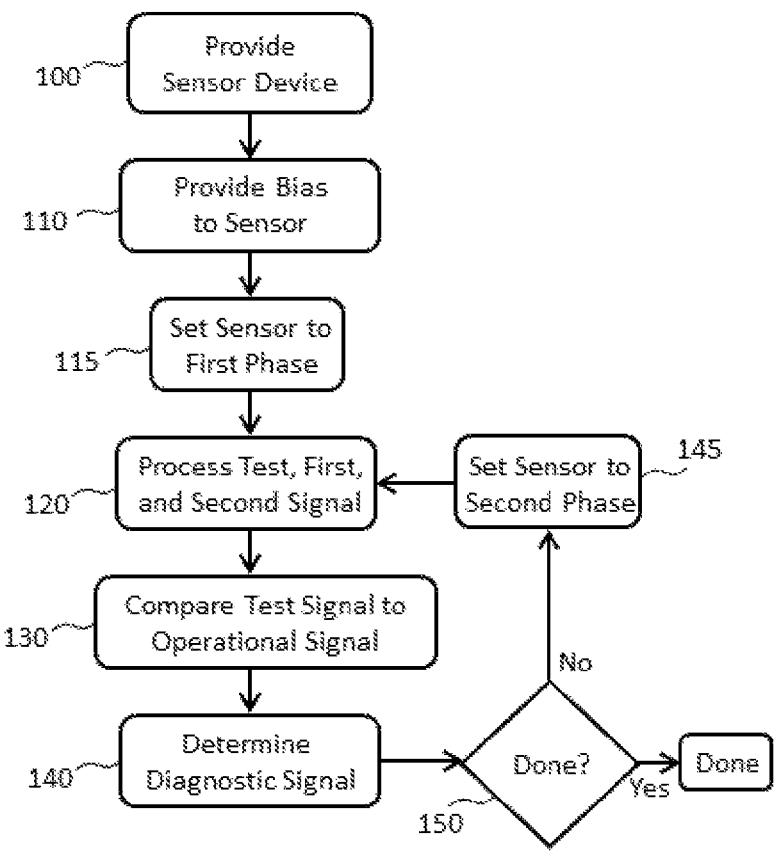
FIG. 5 illustrates a flow chart of another method according to illustrative embodiments of the present invention.

In a further embodiment, referring to FIG. 5, a sensor device 99 is operated by first providing the sensor device 99 in step 100 and providing power to the sensor device 99 in step 110. The sensor 10 of the sensor device 99 is a bridge sensor that is operational in at least two phases or modes. In step 115 the sensor 10 is controlled to operate in a first operational phase, for example by the phase switch 16. The test signal 54 is measured in step 120, for example by processing the test, first and second signals 54, 50, 52 with the processing circuit 44, and compared to the predetermined processing value 49 in step 130 to produce the processing output signal 48. The diagnostic signal 42 is determined, for example by the determination circuit 46, in step 140. If the diagnostic process is complete (step 150), the process is done. If another operational phase is to be diagnosed, the diagnostic process is not complete and the sensor 10 is controlled to operate in a different, e.g. second, operational phase in step 145 and the process repeats. The final diagnostic signal 42 can be a combination of the two (or more) processing output signals 48 or diagnostic signals 42.

Figure 6:
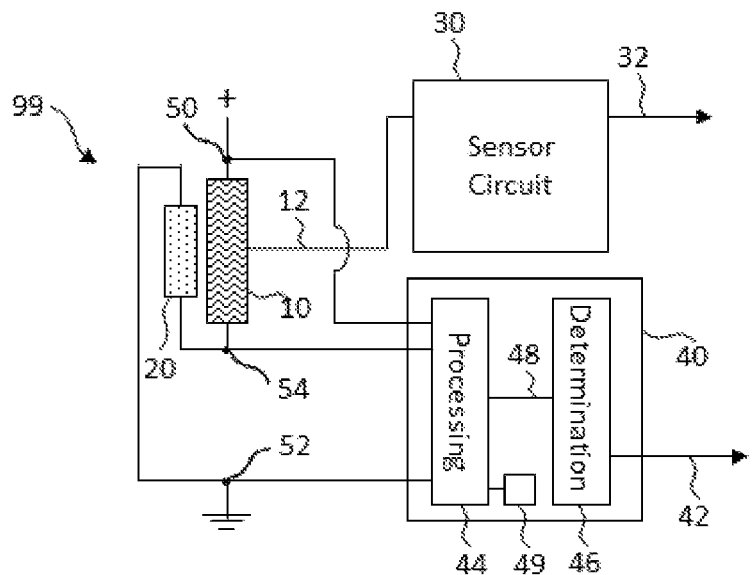
FIG. 6 represents a schematic of an illustrative embodiment of the present invention.

According to embodiments of the present invention, the resistance of the test device 20 is related to the resistance of the sensor 10. However, environmental effects such as mechanical stress, tension, compression, vibration and temperature can affect a circuit component for example the resistance of a resistor. If the sensor 10 is subjected to environmental effects and the test device 20 is not, or vice versa, the resistance of one element can change while the resistance of the other does not, possibly indicating a fault where no fault exists. In embodiments of the present invention, therefore, the test device 20 is located close to the sensor 10 so that both the test device 20 and the sensor 10 are likely to experience the same environmental effects. In some embodiments the test device 20 has a spatial dimension (e.g., a length, width or thickness) and the test device 20 is at least as close to or closer to the sensor 10 than the spatial dimension. In some configurations both the test device 20 and the sensor 10 have an elongated aspect ratio where the elongated direction is the length and the test device 20 and the sensor 10 are disposed adjacent to each other in the width direction, as shown in FIG. 6.

Figure 7:
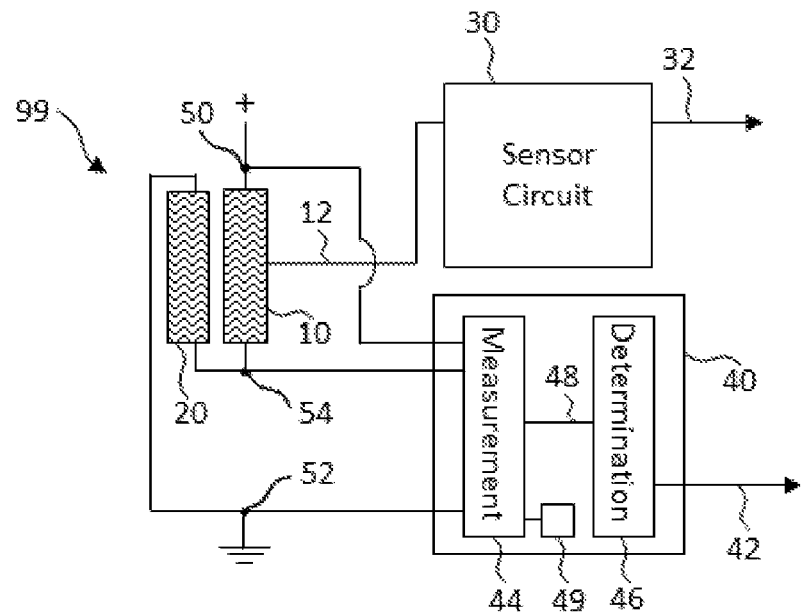
FIG. 7 represents a schematic of another illustrative embodiment of the present invention.
Figure 8:
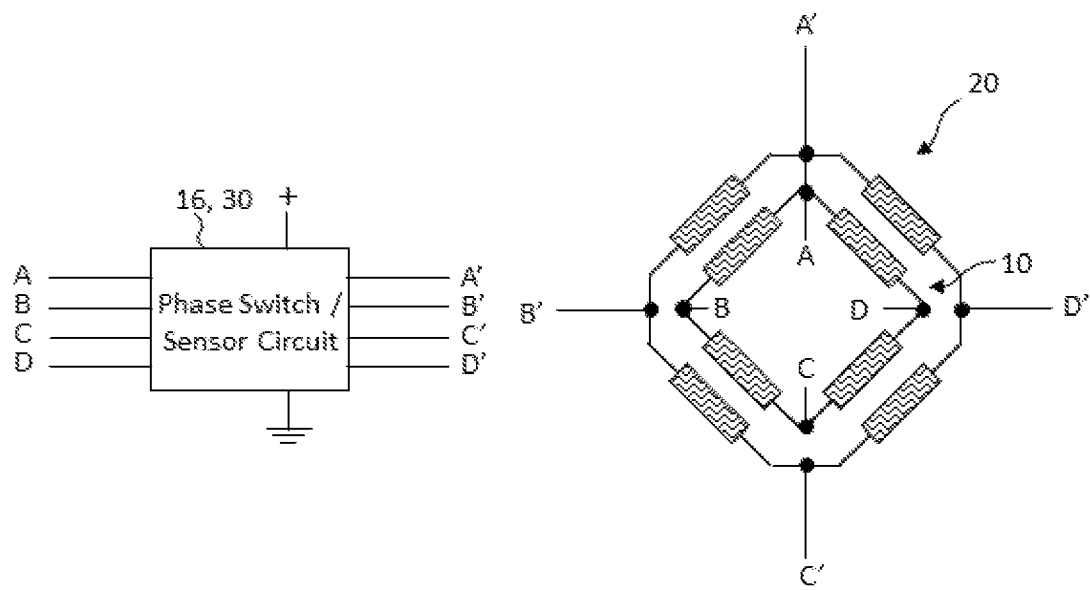
FIG. 8 represents a schematic a schematic of nested bridge sensors according to embodiments of the present invention.

In another embodiment shown in FIG. 7, the test device 20 is also a sensor 10, for example a substantial duplicate of sensor 10. By employing a duplicate sensor 10 as the test device 20, environmental stresses on the sensor 10 are likely to have a similar effect on the test device 20. By substantial duplicate is meant that the test device 20 at least includes some similar materials and components as the sensor 10. In another embodiment the test device 20 is substantially identical to the sensor 10 as far as manufacturing variability and circuit layout allows. In yet another embodiment, referring to FIG. 8, the test device 20 is a duplicate sensor 10 that surrounds the sensor 10. Alternatively, the test device 20 is a duplicate sensor 10 is surrounded by the sensor 10 (not shown). By disposing the test device 20 around or within the sensor 10, both the sensor 10 and the test device 20 are substantially exposed to the same environmental effects and inaccurate test results avoided.

In other embodiments of the present invention, the sensor circuit 30 (or phase switch 16) controls both the test device 20 and sensor 10 and alternately receives sensor information from both or receives sensor information from both at the same time. The received sensor information can be combined to form a sensor device signal 32 with improved accuracy or precision. If the test signal 54 varies outside the desired range, a fault in the test device 20 or the sensor 10 can be determined, depending on the test signal 54. Any one of the connections can be electrically connected to connect the test device 20 and sensor 10 in series (e.g., connections A, A', as shown).

According to embodiments of the present invention, the sensor device 99 functions to measure the environmental attribute at the same time as the sensor 10 is diagnosed. Both the sensor circuit 30 and the monitor circuit 40 function at the same time to provide real-time diagnostic signals 42 corresponding to any or all sensor device signals 32.

In various embodiments of the present invention, each of the sensor 10, the sensor circuit 30 and the monitor circuit 40 (or any of their elements such as the processing circuit 44 and the determination circuit 46) can be implemented in a combination of discrete circuit components or integrated circuits or can be integrated into common circuits or common integrated circuits. In some embodiments the sensor 10, the sensor circuit 30, the monitor circuit 40, the processing circuit 44 or the determination circuit 46 share circuit components or packages. In particular, the processing circuit 44 and the determination circuit 46 can be integrated in a common circuit or in one or more common integrated circuits, either unpackaged as bare die or in a package.

The sensor 10, the phase switch 16, the differential amplifier 14, the differential comparator 18, the processing circuit 44 or the determination circuit 46 can include electronic circuits, digital logic circuits, analog circuits, or mixed-signal circuits or a combination of circuit types and electronic devices. Portions or all of these circuits can be provided in one or more circuits, in common circuits, in one or more integrated circuits or packages, or in common unpackaged or packaged integrated circuits. The various components of the sensor device 99 can be, for example, provided in electronic circuits, integrated circuits or discrete electronic devices that are electrically connected with wires. Any one or all of the various components can be disposed on a printed circuit board or on a semiconductor substrate, or any one or all of the various components can be integrated as a circuit in or on the semiconductor substrate, or some combination of integrated circuits provided on the semiconductor substrate and circuits formed in or the semiconductor substrate. Any one or all of the various components can be provided in packaged integrated circuits or in bare die that are micro-transfer printed onto the semiconductor substrate or other substrate. Wires can be provided using photolithographic methods and materials to connect the various components, integrated circuit dies, or circuits integrated on the semiconductor substrate.

The sensor circuit 30, the monitor circuit 40, the processing circuit 44 and the determination circuit 46 can be functional elements providing the functions described rather than as specific hardware or electronic components and circuits implementing the functions can be the same circuit or use common circuit elements.

In an embodiment the sensor 10 incorporates a sensor semiconductor material (such as GaAs) and the sensor or monitor circuit 30, 40 incorporate silicon material. The sensor 10 can be provided in a first package or semiconductor device and the sensor or monitor circuit 30, 40 can be provided in a second, different package or semiconductor device. The sensor 10 can be physically disposed on and electrically connected to the sensor or monitor circuit 30, 40 to form a single compound structure.

The sensor 10 can be any of various environmental sensors or field sensors such as Hall-effect sensors or magneto-resistive sensors and can be provided, for example, in an integrated circuit, discrete elements or as separate integrated circuit components (such as bare die) mounted on a sensor device substrate, such as a glass, ceramic, polymer or semiconductor substrate. One or more of the integrated circuit components or elements of the sensor device 99 such as the sensor circuit 30 or monitor circuit 40, can be disposed on the sensor 10 as bare die deposited by micro-transfer printing and electrically connected. Alternatively, the sensor 10 can be disposed on the sensor circuit 30 or monitor circuit 40 as bare die deposited by micro-transfer printing and electrically connected. The sensor circuit 30 or monitor circuit 40 can be provided as photolithographically defined circuits in a semiconductor substrate and the sensor 10 can be disposed on the semiconductor substrate as bare die and electrically connected to the sensor or monitor circuits 30, 40 using photolithographic processes and materials.

Embodiments of the present invention can be constructed by providing a substrate and mounting the sensor 10, sensor circuit 30 and monitor circuit 40 as integrated circuits on the substrate. The integrated circuits can be disposed on the substrate surface by micro-transfer printing them from corresponding source wafers onto the substrate surface. Alternatively, the substrate surface can be or include a semiconductor layer and one or more or any portion of each of the sensor 10, sensor circuit 30 and monitor circuit 40 are formed in the semiconductor layer and electrically connected with any integrated circuits disposed on the substrate surface (for example using micro-transfer printing) using wires on the substrate surface, for example by using photolithographic or printed circuit board methods and materials.

The substrate can be one of many substrates with a surface capable of supporting or receiving the sensor 10 and integrated circuits, for example a glass, plastic, ceramic or semiconductor substrate with two opposing relatively planar and parallel sides. The substrate can have a variety of thicknesses, for example from 10 micron to several millimeter. The substrate can be a portion or surface of another device and can include electronic circuitry.

Methods of forming micro-transfer printable structures are described, for example, in the paper "AMOLED Displays using Transfer-Printed Integrated Circuits" (Journal Soc. Information Display, 2011, DOI #10.1889/JSID19.4.335, 1071-0922/11/1904-0335, pp. 335-341) and U.S. 8,889,485, referenced above. For a discussion of micro-transfer printing techniques see, U.S. Pat. Nos. 8,722,458, 7,622,367 and 8,506,867. Micro-transfer printing using compound micro-assembly structures and methods can also be used with the present invention, for example, as described in US2016/093600. In an embodiment the sensor device 99 is a compound micro-assembled device. Additional details useful in understanding and performing aspects of the present invention are described in U.S. Pat. No. 9,520,537.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A sensor device comprising:
a sensor responsive to an external physical quantity of an environmental attribute to produce a sensor signal, the sensor electrically connected to a first signal;
a test device electrically providing a test signal connected in series with the sensor by an electrical test connection, the test device being a test sensor which is a substantial duplicate of said sensor and electrically connected to a second signal, and wherein the first signal, the second signal and the test signal are different signals; and
a monitor circuit electrically connected to the first, second and test signals, the monitor circuit comprising a processing circuit and a determination circuit, wherein the processing circuit is responsive to the test signal and a predetermined processing value to form a processing output signal and wherein the determination circuit is responsive to the processing output signal to determine a diagnostic signal.

2. The sensor device as in claim 1, wherein the test device is a resistor.

3. The sensor device as in claim 1, wherein the test device surrounds the sensor or the sensor surrounds the test device.

4. The sensor device as in claim 1, wherein the processing circuit is arranged to measure the voltage of the first, second or test signals or wherein the processing circuit is arranged to measure the current through the test device or the sensor.

5. The sensor device as in claim 1, wherein the test device has a spatial dimension and the test device is at least as close to or closer to the sensor than said spatial dimension.

6. The sensor device as in claim 1, wherein the sensor is a bridge sensor.

7. The sensor device as in claim 1, wherein the sensor is a field sensor and the field is a magnetic field, an electrical field, a pressure field or a gravitational field, or wherein the sensor is an acceleration sensor, a temperature sensor or a pressure sensor.

8. The sensor device as in claim 1, wherein the first signal is a first voltage bias signal and the second signal is a second voltage bias signal different from the first voltage bias signal, or wherein the first signal is a power signal and the second signal is a ground signal, or wherein the first signal is a ground signal and the second signal is a power signal.

9. The sensor device as in claim 1, wherein the sensor is a Hall-effect sensor or a magneto-resistive sensor.

10. A sensor diagnostic method comprising:
a) providing a sensor device according to claim 1,
b) using an external voltage bias source to provide a first voltage bias signal and a second voltage bias signal different from the first voltage bias signal, to the sensor device or using an external power source to provide a power signal and a ground signal to the sensor device,
c) using the processing circuit to measure the test signal and provide a measured signal, and
d) using the determination circuit to compare the measured signal to a predetermined processing value to determine the diagnostic signal.

11. The sensor diagnostic method as in claim 10, wherein the sensor is a bridge sensor having at least four terminals and at least first and second operational phases, and comprising determining a diagnostic signal in each of the first and second operational phases.

* * * * *